United States Patent [19]

Tanabe et al.

[11] Patent Number: 5,569,886
[45] Date of Patent: Oct. 29, 1996

[54] FLEXIBLE PRINTED CIRCUIT BOARD

[75] Inventors: Kouji Tanabe, Katano; Noahiro Nishioka, Yawata, both of Japan

[73] Assignee: Matsushita Electric Industrial Co., Ltd., Osaka, Japan

[21] Appl. No.: 423,907

[22] Filed: Apr. 18, 1995

Related U.S. Application Data

[62] Division of Ser. No. 230,033, Apr. 19, 1994.

[30] Foreign Application Priority Data

Apr. 27, 1993 [JP] Japan .................................. 5-100911

[51] Int. Cl.⁶ ...................................................... H05K 1/14
[52] U.S. Cl. ........................... 174/260; 174/254; 29/832; 361/767; 361/760; 439/78
[58] Field of Search .......................... 439/77, 67, 78, 439/91; 361/749, 773, 777, 767, 760; 174/254, 260, 261; 29/842, 832; 257/735, 736

[56] References Cited

U.S. PATENT DOCUMENTS

| | | |
|---|---|---|
| 3,699,010 | 10/1972 | Nash . |
| 4,631,820 | 12/1986 | Harada et al. ...................... 174/52.4 X |
| 4,774,634 | 9/1988 | Tate et al. .................. 361/400 |
| 4,779,338 | 10/1988 | Kohara et al. .......................... 29/840 X |
| 4,808,769 | 2/1989 | Nakano et al. ......................... 29/840 X |
| 4,835,847 | 6/1989 | Kamperman ............................... 29/840 |
| 4,855,796 | 8/1989 | Wong et al. ............................. 357/15 |
| 4,857,671 | 8/1989 | Nakano et al. ......................... 29/840 X |
| 4,900,878 | 2/1990 | Ichkhan ...................... 174/258 |
| 4,944,087 | 7/1990 | Landi ......................... 29/848 |
| 5,049,978 | 9/1991 | Bates et al. ................. 357/74 |
| 5,111,364 | 5/1992 | Yoshimoto et al. ..................... 361/399 |
| 5,283,947 | 2/1994 | Santo et al. ................... 29/840 |
| 5,291,375 | 3/1994 | Mukai ...................... 361/760 |

FOREIGN PATENT DOCUMENTS

| | | |
|---|---|---|
| 63-158711 | 1/1988 | Japan . |
| 2-291688 | 12/1990 | Japan . |
| 03-53871 | 5/1991 | Japan . |

Primary Examiner—Laura Thomas
Attorney, Agent, or Firm—Panitch, Schwarze, Jacobs & Nadel, P.C.

[57] ABSTRACT

A flexible printed circuit board is constituted with a first insulation film covering a first insulating resist layer, a second insulation film covering a second insulating resist layer and a printed circuit formed between the first insulating resist layer and the second insulating resist layer, and a terminal of an electronic component is disposed on the printed circuit, and the second insulation film is pressed and heated.

1 Claim, 3 Drawing Sheets

FLEXIBLE PRINTED CIRCUIT BOARD

CROSS-REFERENCE TO RELATED APPLICATION

This is a division of co-pending U.S. patent application Ser. No. 08/230,033, filed Apr. 19, 1994.

FIELD OF THE INVENTION AND RELATED ART STATEMENT

1. Field of the Invention

This invention relates to a method for mounting an electronic component on a flexible printed circuit board which is to be used in an electronic apparatus or the like.

2. Description of the Prior Art

In recent years, various electronic apparatuses are increasingly demanded to be small size and light weight for realization of a portable type or a multifunctional type. A flexible printed circuit board (hereinafter referred to as an FPC) is able to be installed in the electronic apparatuses at a bent portion and an opening space with thin size and light weight. Therefore, the FPC is widely used in the electronic apparatuses.

Conventionally, method for mounting electronic component on the FPC is different in terms of composition of the FPC as follows:

(I) The FPC has a polyimide film used as an insulation film and a copper foil pasted on the polyimide film by means of an insulating resin adhesive or the like and used as a printed circuit.

The electronic component is generally mounted on the copper foil of the FPC by soldering.

(II) The FPC has a polyester film used as the insulation film and a conductive silver resin paste formed on the polyester film by way of printing such as screen printing and used as the printed circuit.

In this FPC, since the printed circuit is formed on the insulation film by way of printing, there is an advantage to manufacture the FPC with low cost. However, on the other hand, the electronic component can :not be mounted by soldering directly on the conductive silver resin paste of the FPC. Therefore, in this FPC, the electronic component is mounted usually with the following steps:

(1) an electrode part is provided with the printed circuit on the insulation film, (2) a terminal of the electronic component is connected with the electrode part via the conductive adhesive, and (3) in order to reinforce a connecting portion having the terminal and the electrode part, an insulating resin adhesive is applied around the connecting portion with a dispenser or the like.

Furthermore, in a method for connecting the terminal of the electronic component with the printed circuit, apart from the above-mentioned method, the following two methods have been known.

(I) A method described in the unexamined published Japanese application (TOKKAI) SHO 63-158711 wherein (1) the terminal is disposed between two thermoplastic insulation films so as to face the printed circuit, (2) the terminal is connected with the printed circuit via the conductive adhesive, and (3) two thermoplastic insulation films are made hot melt each other in order to reinforce the connecting portion.

(II) A method described in the unexamined published Japanese application (TOKKAI) HEI 2-291688 wherein (1) the terminal is disposed between two thermoplastic insulation films so as to face the printed circuit, and (2) the terminal is adhered and connected with the printed circuit via a conductive anisotropic adhesive.

However, in the above-mentioned three conventional methods, there exist steps for connecting the terminal with the printed circuit by the conductive adhesive or the conductive anisotropic adhesive. Therefore, in the step of using the conductive adhesive, an expensive curing oven is required to harden the conductive adhesive, and cost of mounting work must inevitably be high. In the step of using the conductive anisotropic adhesive, a special conductive suspension is required to connect the terminal with the printed circuit, and it is difficult to maintain the quality of the special conductive suspension. Furthermore, in the above-mentioned conventional methods, it is necessary that the connecting portion must be reinforced by means of the insulating resin adhesive or making the hot melt of two thermoplastic insulation films. Therefore, in the step of using the insulating resin adhesive, the expensive curing oven is required to harden the insulating resin adhesive, and cost of mounting work must inevitably be high. In the step of making the hot melt of two thermoplastic insulation films, the thermoplastic insulation film is deformed, and hence, another printed circuit can not be formed on the thermoplastic insulation film.

OBJECT AND SUMMARY OF THE INVENTION

The object of the present invention is to offer method for mounting electronic component on a flexible printed circuit board that can solve the aforementioned problems.

In order to achieve the above object, method for mounting electronic component on a flexible printed circuit board of the present invention comprises steps of:

forming a first printed circuit by way of printing on one face of a first insulation film, which has a property of at least one of thermoplasticity and thermosetting property;

covering the first printed circuit and the one face of the first insulation film by way of printing with a first insulating resist layer, which has a property of at least one of thermoplasticity and a property of thermosetting and heating adhesion;

forming a second printed circuit by way of printing on one face of the first insulating resist layer;

disposing a terminal of an electronic component on a second connecting part of the second printed circuit;

covering a first face of a second insulation film, which has a property of at least one of thermoplasticity and thermosetting property, by way of printing with a second insulating resist layer, which has a property of at least one of thermoplasticity and a property of thermosetting and heating adhesion, and disposing the second insulation film on the one face of the first insulating resist layer in a manner that the second connecting part and the terminal are disposed between the one face of the first insulating resist layer and one face of the second insulating resist layer; and pressing a second face of the second insulation film in a manner to connect the terminal with the second connecting part and heating the second face of the second insulation film in a manner to weld the one face of the first insulating resist layer and the one face of the second insulating resist layer.

In the above-mentioned mounting method of the present invention, the terminal of the electronic component is connected with the second connecting part of the second printed circuit without any step of using the conductive adhesive and the conductive anisotropic adhesive. Therefore, in the present mounting method, neither the conventional expensive curing oven nor the special conductive suspension is required. Thereby, mounting work is made simple, and its cost is low. Furthermore, in the present mounting method, the terminal is disposed directly on the second connecting part, and both the one faces of the first and the second insulating resist layers, which are disposed sandwiched between the terminal and the second connecting part, are pressurized and heated via the second insulation film eliminating from deforming the first insulation film. Therefore, in the present mounting method, plural printed circuits can be formed on the flexible printed circuit board, and the electrical connection between the terminal and the second connecting part is made strong and achieves high reliability. Furthermore, in the present mounting method, since there is no step of reinforcing a connecting portion having the terminal and the second connecting part with the insulating resin adhesive, the expensive curing oven is not required. Therefore, mounting work is made simple, and its cost is low.

DESCRIPTION OF THE PREFERRED EMBODIMENT

Hereafter, preferred embodiments of the present invention are described with reference to the accompanying drawings.

GENERAL EXAMPLE

Figure 1:
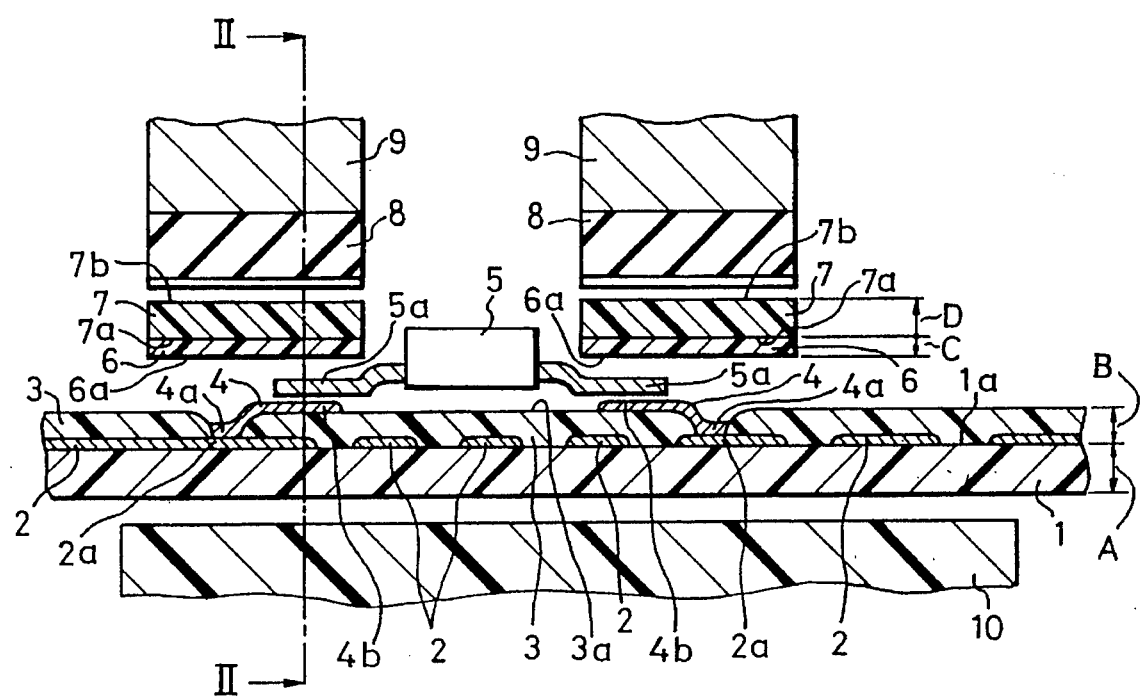
FIG. 1 is a partially cross-sectional view showing an arrangement of mounting members and an electronic component to be mounted on a flexible printed circuit board.

FIG. 1 is a partially cross-sectional view showing an arrangement of mounting members and an electronic component to be mounted on a flexible printed circuit board.

In FIG. 1, a first printed circuit 2 is formed on one face 1a of a first insulation film 1, which has a property of at least one of thermoplasticity and thermosetting property, by way of printing, such as screen printing or the like.

The first printed circuit 2 and the one face 1a of the first insulation film 1 are covered with a first insulating resist layer 3, which has a property of at least one of thermoplasticity and a property of thermosetting and heating adhesion, by way of printing except a connecting part 2a of the first printed circuit 2.

A second printed circuit 4 is formed on one face 3a of the first insulating resist layer 3 by way of printing so as to connect the connecting part 2a with a first connecting part 4a of the second printed circuit 4.

Apart from the aforementioned explanation, where the first printed circuit 2 and the one face 1a of the first insulation film 1 are covered with the first insulating resist layer 3 except the connecting part 2a in order to connect the connecting part 2a with a first connecting part 4a of the second printed circuit 4, an alternative method may be such that the whole of the first printed circuit 2 and the one face 1a of the first insulation film 1 are covered with the first insulating resist layer 3, and the second printed circuit 4 is formed on the one face 3a of the first insulating resist layer 3 by way of printing.

A terminal 5a of an electronic component 5 is disposed on a second connecting part 4b of the second printed circuit 4. In the flexible printed circuit board (hereinafter referred to as the FPC), for example, four electronic components 5 are to be mounted on the FPC in parallel with each other in FIG. 1 from the face side to the back side.

A first face 7a of a second insulation film 7, which has a property of at least one of thermoplasticity and thermosetting property, is covered with a second insulating resist layer 6, which has a property of at least one of thermoplasticity and a property of thermosetting and heating adhesion, by way of printing. And the second Insulation film 7 is disposed on the one face 3a of the first insulating resist layer 3 such that the second connecting part 4b and the terminal 5a are disposed between the one face 3a of the first insulating resist layer 3 and one face 6a of the second insulating resist layer 6.

Figure 2:
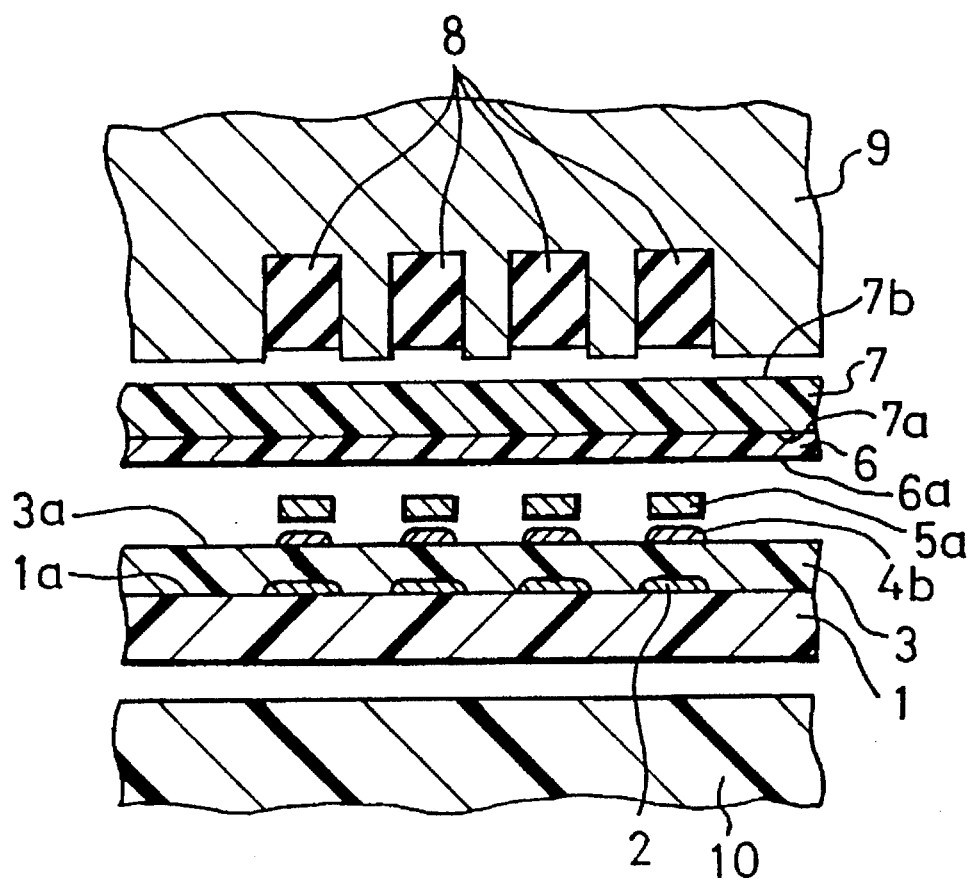
FIG. 2 is a vertical sectional view taken on line II—II in FIG. 1.

As a last step of the present mounting method, a second face 7b of the second insulation film 7 is pressed and heated as below-mentioned. A preferred example of this last step will be explained with reference to FIG. 2. FIG. 2 is a vertical sectional view taken on line II—II in FIG. 1.

In FIG. 2, four elastic rubbers 8 are disposed with four recesses of an ultrasonic horn 9 provided at an end part of an ultrasonic welding apparatus, respectively. The ultrasonic horn 9 has high rigidity and substantially emits an ultrasonic wave. As shown in FIG. 2, the ultrasonic horn 9 is disposed above the second face 7b of the second insulation film 7 so that the vertical center axes of four terminals 5a are disposed on the vertical center axes of four elastic rubbers 8, respectively. When the ultrasonic horn 9 comes in contact with the second face 7b of the second insulation film 7, the ultrasonic horn 9 presses the second face 7b of the second insulation film 7, and the ultrasonic wave heats the second face 7b of the second insulation film 7 so as to weld the one face 3a of the first insulating resist layer 3 and the one face 6a of the second insulating resist layer 6. At the same time, four elastic rubbers 8 press the second face 7b of the second insulation film 7 so as to connect the terminal 5a with the second connecting part 4b tightly. In this last step, as shown in FIG. 1 and FIG. 2, it is preferred that the mounting work is done on a rigid supporting stand 10.

Figure 3A:
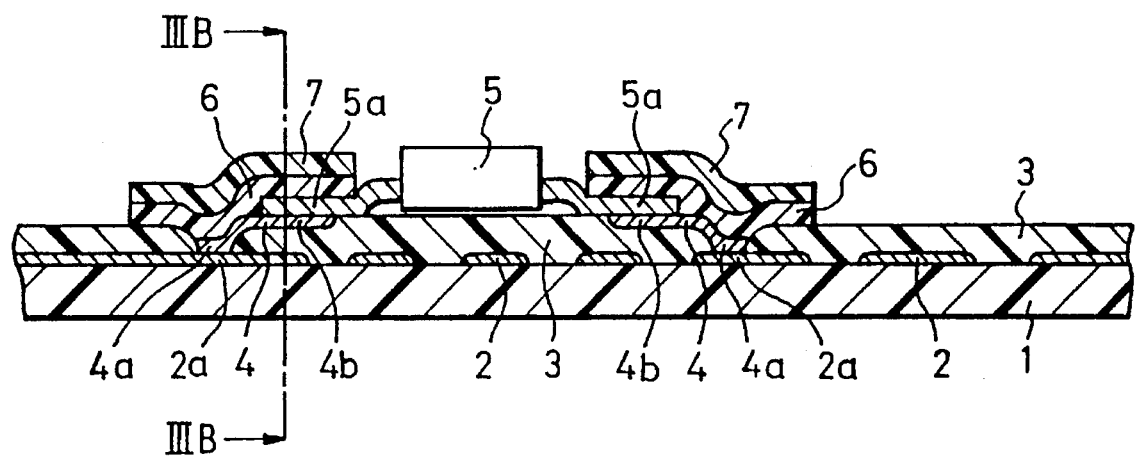
FIG. 3A is a partially cross-sectional view showing the completed state of the electronic component and the flexible printed circuit board.
Figure 3B:
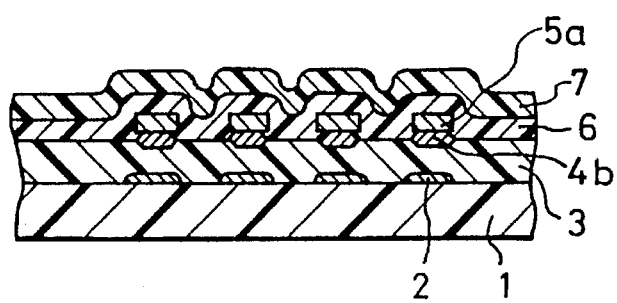
FIG. 3B is a vertical sectional view taken on line IIIB—IIIB in FIG. 3A.

A completed state of an assembly of electronic component 5 and the FPC mounting it thereon will be explained with reference to FIG. 3A and FIG. 3B. FIG. 3A is a partially cross-sectional view showing the completed state of the electronic component and the flexible printed circuit board. FIG. 3B is a vertical sectional view taken on line IIIB—IIIB in FIG. 3A.

In FIG. 3A and FIG. 3B, the terminal 5a is connected with the second connecting part 4b, and the first connecting part 4a is connected with the connecting part 2a. In the welding of the first insulating resist layer 3 to the second insulating resist layer 6, deforming of the first insulation film 1 is not raised. This is because the heat produced by the ultrasonic welding is transmitted only from the second insulation film 7 to the second insulating resist layer 6 and the first insulating resist layer 3, and the heat is not transmitted to the first insulation film 1, because the application of the ultrasonic wave and pressing by the elastic rubbers 8 is limited to a very short time of, for example, 0.2 second. Moreover, as shown in FIG. 3B, since the first insulating resist layer 3 exists between the first printed circuit 2 and the second connecting part 4b, the second connecting part 4b is not connected with the first printed circuit 2 directly. Namely, in case the whole of the first printed circuit 2 and the one face 1a of the first insulation film 1 are covered with a first insulating resist layer 3, even if the electronic component 5 is mounted on the second printed circuit 4, the second printed circuit 4 is not connected with the first printed circuit 2.

Apart from the aforementioned explanation, where the first printed circuit 2 is formed on the one face 1a of the first insulation film 1 by way of printing, an alternative method may be such that the first printed circuit 2, which is a metallic foil, is formed on the one face 1a of the first insulation film 1 by an insulating resin adhesive.

Subsequently, concrete embodiments will be explained in the below-mentioned four examples.

FIRST EXAMPLE

In this first example, the electronic component and each materials of the FPC and lengths of the example shown in FIG. 1 are as follows:

the first insulation film 1 is of "a polyester film";

the first printed circuit 2 is of "a conductive silver resin paste" (Type DX-750H manufactured by TOYOBO CO., LTD);

the first insulating resist layer 3 is of "an insulating resist of a vinyl chloride resin" (Type XB-803A manufactured by FUJIKURA CHEMICAL, LTD);

the second printed circuit 4 is of "a conductive silver resin paste" (Type DX-750H manufactured by TOYOBO CO., LTD);

the electronic component 5 is of "a light emitting diode" (hereinafter referred to as a LED);

the second insulating resist layer 6 is of "an insulating resist of a vinyl chloride resin" (Type XB-803A manufactured by FUJIKURA CHEMICAL, LTD);

the second insulation film 7 is of "a polyester film"; and

A=75 μm, B=60 μm,
C=20 μm, D=50 μm.

The LED 5 is mounted on the FPC according to the present mounting method as follows:

(1) A first printed circuit 2 is formed on one face 1a of a first insulation film 1 by way of screen printing.

(2) The first printed circuit 2 and the one face 1a of the first insulation film 1 are covered with a first insulating resist layer 3 by way of screen printing except a connecting part 2a of the first printed circuit 2.

(3) A second printed circuit 4 is formed on one face 3a of the first insulating resist layer 3 by way of screen printing so as to connect the connecting part 2a with a first connecting part 4a of the second printed circuit 4.

(4) A terminal 5a of the LED 5 is disposed on a second connecting part 4b of the second printed circuit 4.

(5) A first face 7a of a second insulation film 7 is covered with a second insulating resist layer 6 by way of screen printing. And the second insulation film 7 is disposed on the one face 3a of the first insulating resist layer 3 so that the second connecting part 4b and the terminal 5a are disposed between the one face 3a of the first insulating resist layer 3 and one face 6a of the second insulating resist layer 6.

(6) The second face 7b of the second insulation film 7 is pressed by the elastic rubber 8 so as to connect the terminal 5a with the second connecting part 4b tightly. At the same time, the second face 7b of the second insulation film 7 is heated by the ultrasonic wave emitted from the ultrasonic horn 9 so as to weld the one face 3a of the first insulating resist layer 3 and the one face 6a of the second insulating resist layer 6 with each other.

In this step of pressing and heating, as the elastic rubbers 8 are used a polyurethane rubber (hardness of elasticity=60). A condition of heating is as follows:

The ultrasonic welding apparatus: type 34 manufactured by SEIDENSYA CO., LTD

An emitting frequency: 20 kHz

An emitting second: 0.2 second

Now, the varied test results of the FPC, on which the LED 5 is mounted in accordance with the aforementioned mounting method, will be described as follows:

A strength test was made that a load, which is applied to the LED 5 in FIG. 1 from the face side to the back side, is shown until the LED 5 is peeled off the FPC. The test result is as follows:

The load=between 28 (N) and 36 (N) (sample numbers: 30)

A heat resistance test was made in which the FPC is put in a test equipment kept with 85 degree Celsius for one hour. The test result is as follows:

(I) The connection between the LED 5 and the second printed circuit 4 was in a normal condition.

(II) Insulation properties of the first and the second insulation films 1 and 8 were in normal conditions.

(III) Insulation properties of the first and the second insulating resist layers 3 and 6 were in normal conditions.

A humidity test was made in which the FPC is put in a test equipment kept between 60% RH and 65% RH for one hour. The test result is as follows:

(I) The connection between the LED 5 and the second printed circuit 4 was in a normal condition.

(II) Insulation properties of the first and the second insulation films 1 and 8 were in normal conditions.

(III) Insulation properties of the first and the second insulating resist layers 3 and 6 were in normal conditions.

A thermal shock test was made in which the FPC is put in a test equipment kept with 85 degree Celsius for one hour and put in another test equipment kept with −40 degree Celsius by five hundred turns. The test result is as follows:

(I) The connection between the LED 5 and the second printed circuit 4 was in a normal condition.

(II) Insulation properties of the first and the second insulation films 1 and 8 were in normal conditions.

(III) Insulation properties of the first and the second insulating resist layers 3 and 6 were in normal conditions.

SECOND EXAMPLE

In this second example, the first and the second insulating resist layers 3 and 6 are changed into the below-mentioned materials from the materials of the first embodiment. The other materials of the FPC, the LED 5 and the mounting method is all the same as the first embodiment. The same components and parts as those of the first embodiment are designated by the same numerals and corresponding descriptions similarly apply. Therefore, the same explanation is omitted.

The first and the second insulating resist layers 3 and 6 are of "an insulating resist of a denatured epoxide urethane resin" (Type EP-2940 manufactured by TOYOBO CO., LTD is made adjunction and bridge formation with a chemical equivalent isocyanate.

Now, in this second example, the varied test results of the FPC, on which the LED 5 is mounted in accordance with the aforementioned mounting method, will be described as follows:

A strength test was made in which a load, which is applied to the LED 5 in FIG. 1 from the face side to the back side, is shown until the LED 5 is peeled off the FPC. The test result is as follows:

The load=between 33 (N) and 42 (N) (sample numbers: 30)

A heat resistance test was made in which the FPC is put in a test equipment kept with 85 degree Celsius for one hour. The test result is as follows:
 (I) The connection between the LED 5 and the second printed circuit 4 was in a normal condition.
 (II) Insulation properties of the first and the second insulation films 1 and 8 were in normal conditions.
 (III) Insulation properties of the first and the second insulating resist layers 3 and 6 were in normal conditions.

A humidity test was made in which the FPC is put in a test equipment kept between 60% RH and 65% RH for one hour. The test result is as follows:
 (I) The connection between the LED 5 and the second printed circuit 4 was in a normal condition.
 (II) Insulation properties of the first and the second insulation films 1 and 8 were in normal conditions.
 (III) Insulation properties of the first and the second insulating resist layers 3 and 6 were in normal conditions.

A thermal shock test was made in which the FPC is put in a test equipment kept with 85 degree Celsius for one hour and put in another test equipment kept with −40 degree Celsius by five hundred turns. The test result is as follows:
 (I) The connection between the LED 5 and the second printed circuit 4 was In a normal condition.
 (II) Insulation properties of the first and the second insulation films 1 and 8 were in normal conditions.
 (III) Insulation properties of the first and the second insulating resist layers 3 and 6 were in normal conditions.

THIRD EXAMPLE

In this third example, the second insulating resist layer 6 is changed into the below-mentioned material from the materials of the first embodiment. The other materials of the FPC, the LED 5 and the mounting method is all the same as the first embodiment. The same components and parts as those of the first embodiment are designated by the same numerals and corresponding descriptions similarly apply. Therefore, the same explanation is omitted.

The second insulating resist layer 6 is of "an insulating resist of a denatured epoxide urethane resin" Type EP-2940 manufactured by TOYOBO CO., LTD is made adjunction and bridge formation with a chemical equivalent isocyanate.

Now, in this third example, the varied test results of the FPC, on which the LED 5 is mounted in accordance with the aforementioned mounting method, will be described as follows:

A strength test was made in which a load, which is applied to the LED 5 in FIG. 1 from the face side to the back side, is shown until the LED 5 is peeled off the FPC. The test result is as follows:

The load=between 28 (N) and 32 (N) (sample numbers: 30)

A heat resistance test was made in which the FPC is put in a test equipment kept with 85 degree Celsius for one hour. The test result is as follows:
 (I) The connection between the LED 5 and the second printed circuit 4 was in a normal condition.
 (II) Insulation properties of the first and the second insulation films 1 and 8 were in normal conditions.
 (III) Insulation properties of the first and the second insulating resist layers 3 and 6 were in normal conditions.

A humidity test was made in which the FPC is put in a test equipment kept between 60% RH and 65% RH for one hour. The test result is as follows:
 (I) The connection between the LED 5 and the second printed circuit 4 was in a normal condition.
 (II) Insulation properties of the first and the second insulation films 1 and 8 were in normal conditions.
 (III) Insulation properties of the first and the second insulating resist layers 3 and 6 were in normal conditions.

A thermal shock test was made in which the FPC is put in a test equipment kept with 85 degree Celsius for one hour and put in another test equipment kept with −40 degree Celsius by five hundred turns. The test result is as follows:
 (I) The connection between the LED 5 and the second printed circuit 4 was in a normal condition.
 (II) Insulation properties of the first and the second Insulation films 1 and 8 were in normal conditions.
 (III) Insulation properties of the first and the second insulating resist layers 3 and 6 were in normal conditions.

FOURTH EXAMPLE

In this fourth example, a slide switch, a rheostat, a transistor and an integrated circuit are used as the electronic component instead of the LED 5, respectively. The materials of the FPC and the mounting method are all the same as the first embodiment. The same components and parts as those of the first embodiment are designated by the same numerals and corresponding descriptions similarly apply. Therefore, the same explanation is omitted.

In this fourth example, connecting strengths between the above-mentioned electronic components and the second printed circuit 4 is enough as well as the first embodiment. In mounting the slide switch or the rheostat on the FPC, an aluminum board (not shown), which has a thickness of 0.5 mm, is settled below the back face of the first insulation film 1 with a pressure sensitive adhesive double coated tape (which is used type 500 of NITTO DENKHO CO., LTD.) in view of handling of an operation lever or an operation axe.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A flexible printed circuit board comprising:

a first insulation film, a first printed circuit having a first connecting part, said first printed circuit being formed on one face of said first insulation film, a first insulating resist layer having an insertion opening, said first insulating resist layer being formed on one face of said first insulation film and said first printed circuit such that said insertion opening is disposed on said first connecting part, a second printed circuit having a second connecting part and a third connecting part, said second printed circuit being formed on one face of said first insulating resist layer such that said second connecting part is in electrical and mechanical contact with said first connecting part, an electronic component having a terminal, said electronic component being disposed on said second printed circuit in a manner that said terminal is in electrical and mechanical contact with said third connecting part, and a second insulation film having a second insulating resist layer, said second insulating resist layer being formed on one face of said second insulation film, said second insulation film and said second insulating resist layer being disposed on at least said terminal, and said second insulating resist layer being mechanically connected with said one face of said first insulating resist layer, said second insulating resist layer and said first insulating resist layer having a welded interface therebetween.

* * * * *

UNITED STATES PATENT AND TRADEMARK OFFICE
CERTIFICATE OF CORRECTION

PATENT NO. : 5,569,886
DATED      : October 29, 1996
INVENTOR(S) : Kouji Tanabe and Naohiro Nishioka It is certified that error appears in the above-indentified patent and that said Letters Patent is hereby corrected as shown below:

on the cover page of the above-identified patent, in item [75]:

before "Nishioka", please delete "Noahiro".

before "Nishioka", please add --Naohiro--.

Signed and Sealed this

Twenty-seventh Day of May, 1997

Attest:

BRUCE LEHMAN

Attesting Officer    Commissioner of Patents and Trademarks